(12) United States Patent
Chen

(10) Patent No.: US 7,662,521 B2
(45) Date of Patent: Feb. 16, 2010

(54) METHOD OF MASK MAKING TO PREVENT PHASE EDGE AND OVERLAY SHIFT FOR CHROME-LESS PHASE SHIFTING MASK

(75) Inventor: Yung Tin Chen, Santa Clara, CA (US)

(73) Assignee: SanDisk 3D, LLC, Milpitas, CA (US)

( * ) Notice: Subject to any disclaimer, the term of this patent is extended or adjusted under 35 U.S.C. 154(b) by 525 days.

(21) Appl. No.: 11/470,359

(22) Filed: Sep. 6, 2006

(65) Prior Publication Data
US 2008/0057409 A1    Mar. 6, 2008

(51) Int. Cl.
G03F 1/00    (2006.01)
(52) U.S. Cl. .......................................................... 430/5
(58) Field of Classification Search .................... 430/5, 430/311, 394; 716/19, 20, 21
See application file for complete search history.

(56) References Cited

U.S. PATENT DOCUMENTS

| | | | | |
|---|---|---|---|---|
| 5,773,196 A | * | 6/1998 | Shih | ............................ 430/313 |
| 2004/0091794 A1 | | 5/2004 | Kim et al. | |
| 2005/0164097 A1 | | 7/2005 | Benz | |
| 2005/0221200 A1 | | 10/2005 | Chen | |
| 2006/0147819 A1 | | 7/2006 | Yoon et al. | |

\* cited by examiner

*Primary Examiner*—Stephen Rosasco
(74) *Attorney, Agent, or Firm*—Foley & Lardner LLP

(57) ABSTRACT

The formation of a chrome-less phase shifting mask includes preparing a mask substrate with a chrome metal layer, forming main and complementary pattern portions in the chrome metal layer, removing a remaining layer of radiation sensitive material, forming a layer of radiation sensitive material over the complementary pattern portion, etching the main pattern portion of the mask substrate using the patterned chrome metal layer as an etch mask, removing remaining portions of the chrome layer from the main pattern portion and removing the layer of radiation sensitive material over the complementary pattern portion. The fabrication of a chrome-less phase shifting mask includes combining writing a phase layer and a chrome layer into a single write step in a chrome-less phase shifting mask fabrication process, wherein an overlay shift is prevented between the phase layer and the chrome layer. A phase edge is not formed between a juncture of a main pattern region and a scribe region of the mask during fabrication of the mask.

20 Claims, 11 Drawing Sheets

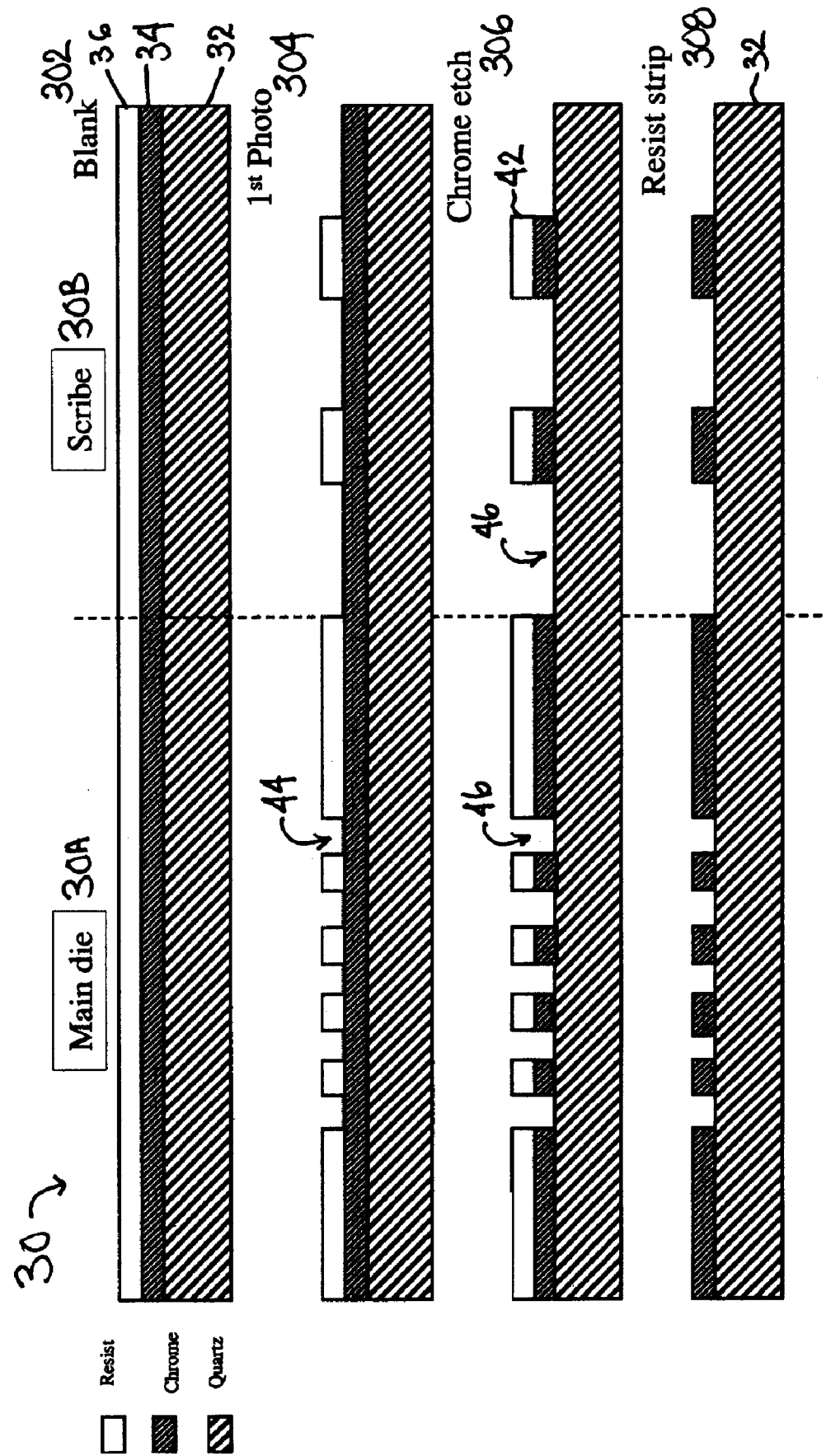

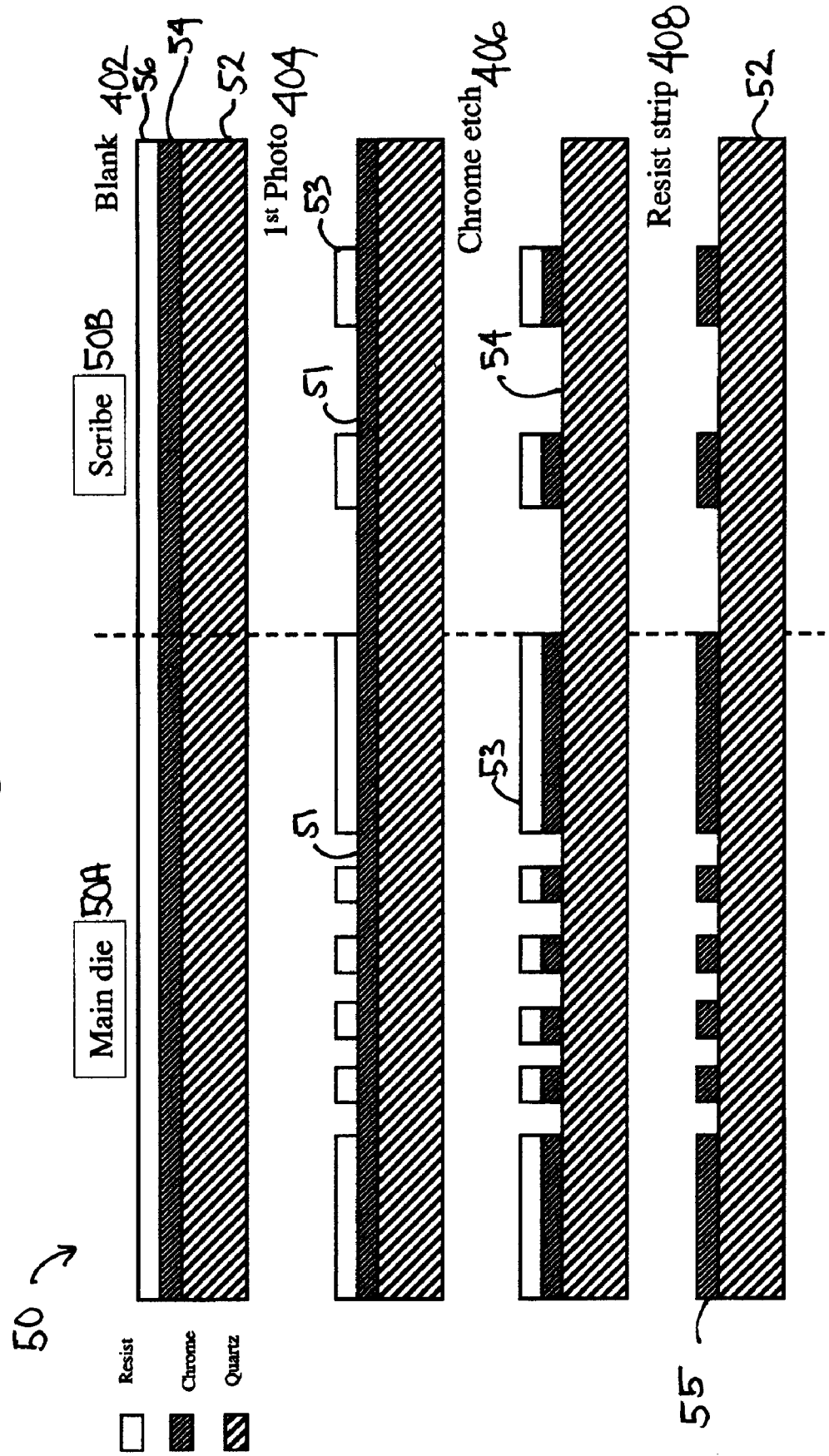

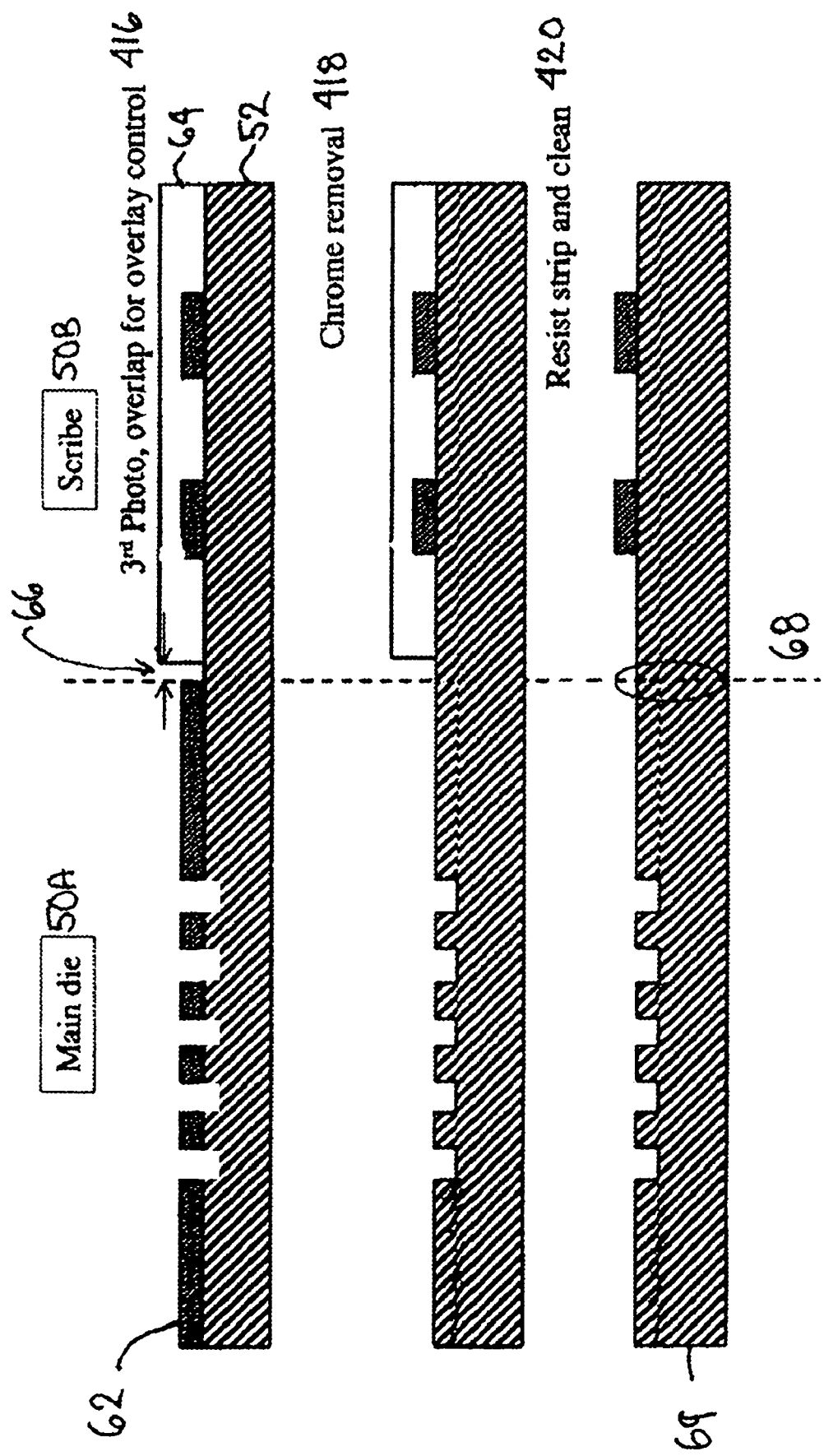

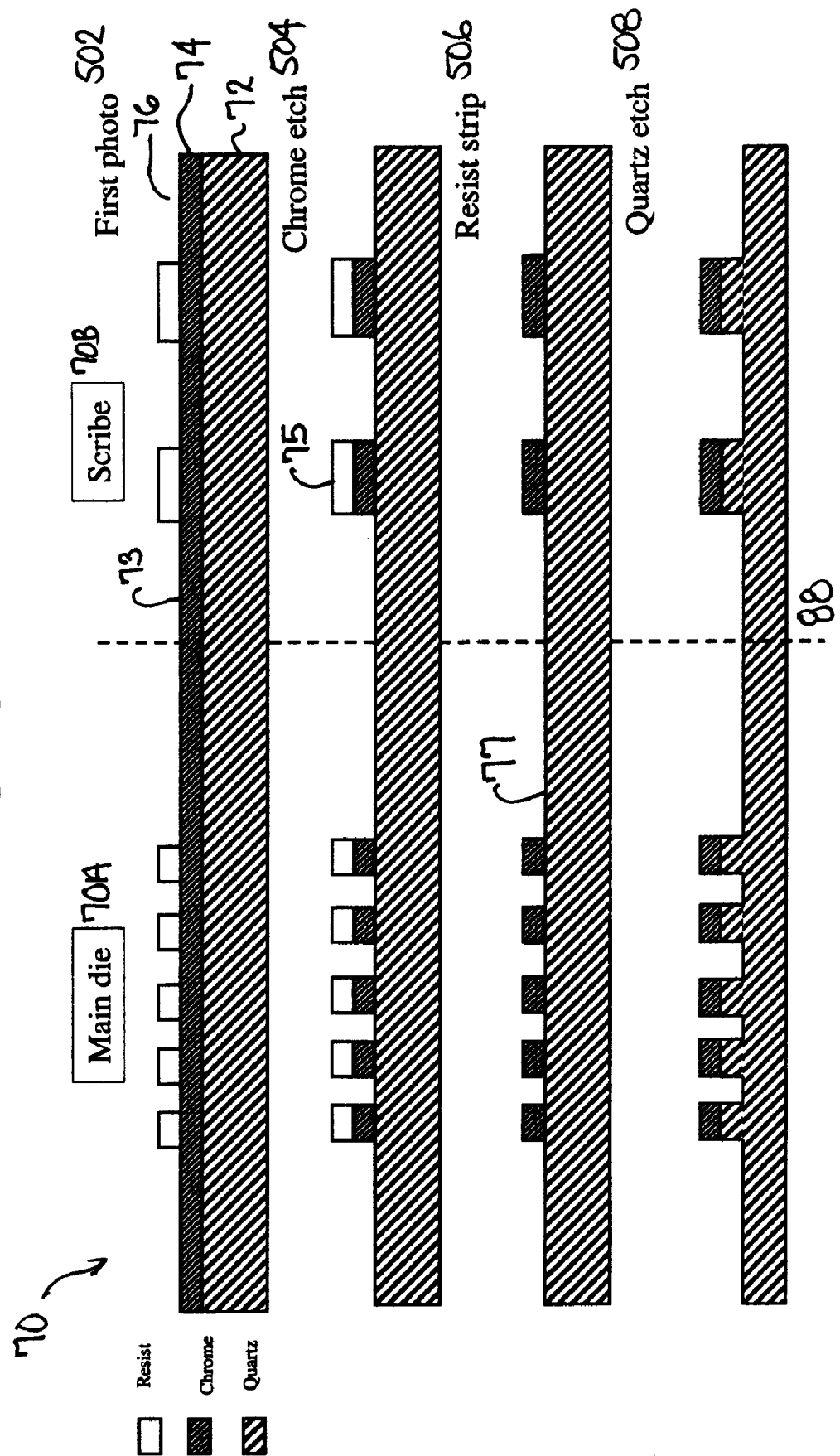

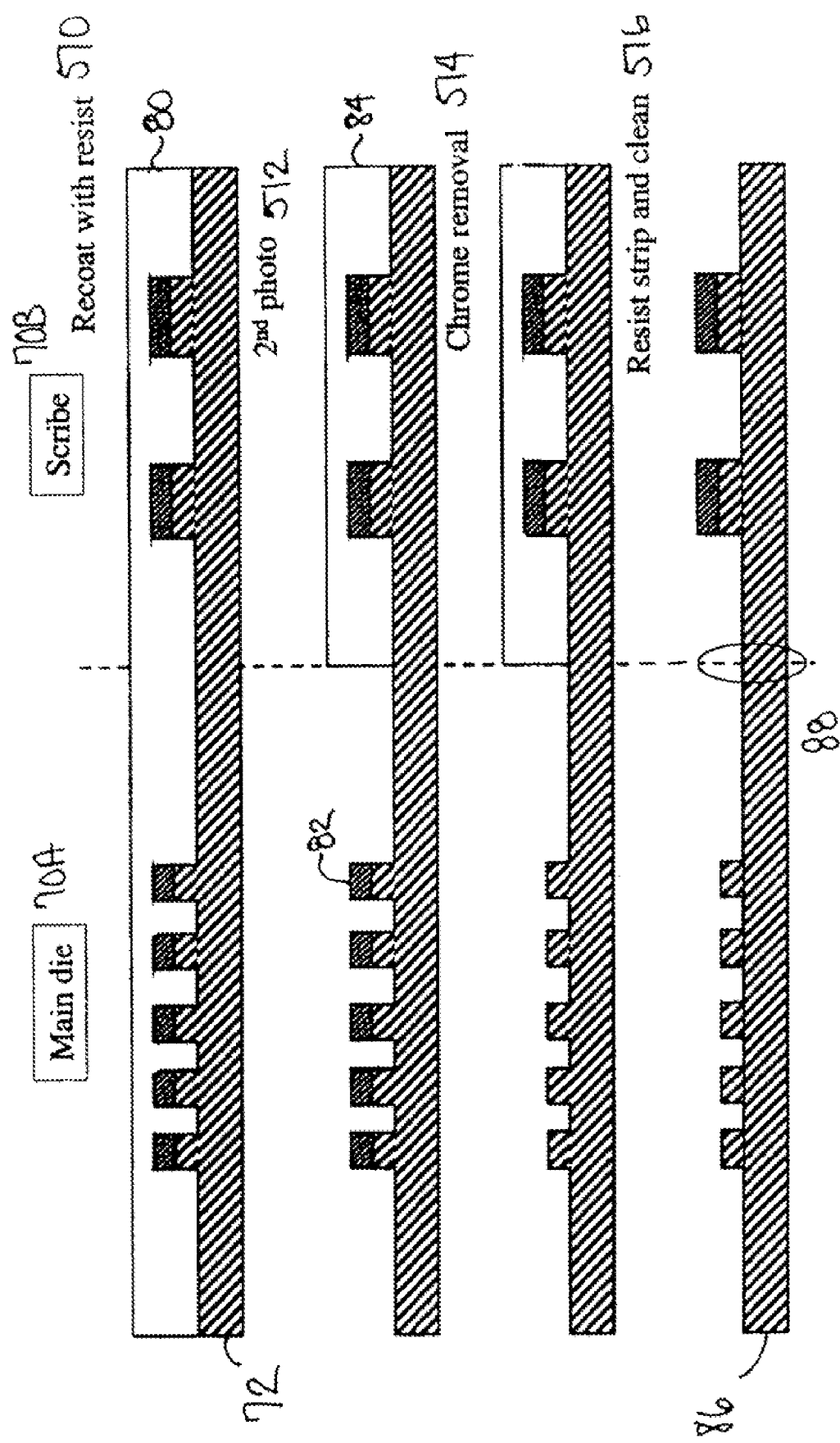

METHOD OF MASK MAKING TO PREVENT PHASE EDGE AND OVERLAY SHIFT FOR CHROME-LESS PHASE SHIFTING MASK

BACKGROUND

1. Field

The disclosed embodiments generally relate to fabricating semiconductor devices. In particular, the disclosed embodiments relate to preventing overlay shift and avoiding phase edge formation during fabrication of a chrome-less phase shifting mask.

2. Brief Description of Related Developments

When producing small structures for semiconductor devices, alternating phase shift masks or chrome-less phase shift masks structured by quartz etching can be used in the photolithographic process.

The alternating phase shift masks or chrome-less masks use a transparent pattern formed on or in a transparent mask substrate to create a phase difference that produces a photoresist pattern.

The fabrication of chrome-less phase shifting masks generally involves two or more mask writing steps. The mask writing steps can include writing a phase layer, which includes a main die and PCM, and a chrome layer, which includes fab structures, such as for example, alignment marks and overlay boxes.

Referring to FIG. 1 for example, a mask substrate 10 is formed 100 that includes a layer 12 of a transmitting material, such as for example, quartz, and a layer 14 of a light block mask, such as for example chromium or chrome. The mask substrate 10 can be formed in any suitable process. A layer 16 of a radiation sensitive material, or photoresist, is formed or deposited over the light blocker mask 14 in any suitable manner. The substrate 10 can be divided into a main die or pattern region 10A and a scribe region 10B. The main pattern region 10A is used to form the pattern photomask. The scribe region 10B is used to fabricate alignment and overlay marks.

The overlay control between the writing steps in the mask formation is critical and different. For example referring to FIG. 1A, a mask writing step generally comprises forming 102 a pattern, in a first photolithographic process, on the main pattern portion 10A of the mask substrate 10. The light blocking mask 14 of the mask substrate 10 is then etched 104 using the main pattern portion 10A as an etch mask. This generally involves removing the chrome from the unmasked areas. The substrate 10 is then etched 106 again using an etching process that is capable of etching the silicon oxide layers, equivalent to the quartz layer 12 comprising the mask substrate 10.

To pattern the scribe region 10B of FIG. 1B, the mask substrate 10 is recoated 108 with a second layer 18 of resist and exposed to a second photolithograph process 110, which generally involves using a tool that is different from the tool used in the first photolithographic process 102. The exposed areas of the chrome layer 14 are removed 112 in a suitable etching process, and the structure is cleaned to remove any particles produced by the etching process.

The two step process of FIGS. 1A and 1B causes significant issues with respect to overlay control between the writing steps. In the above process, the overlay control is generally inconsistent and difficult to control. It would thus be advantageous to be able to fabricate a chrome-less phase shifting mask while preventing an overlay shift between the formation of the phase layer and the chrome layer Another drawback with the conventional alternating or chrome-less phase shifting mask is the creation of residual photoresist features, or phase edge formation after development of the photo resist. A photoresist feature can generally be described as a discrete feature formed by exposing and developing photoresist. The photoresist feature is surrounded by exposed wafer surfaces after development of the photoresist. Residual photoresist features, or phase edges, are generally formed at phase transition boundaries. An example of the formation of a phase edge in a chome-less phase shifting mask process is shown with respect to the one step process flow of FIGS. 2A and 2B.

Referring to FIGS. 2A and 2B, in a first photolithography step 200, the resist layer 22 of the mask substrate 20 has been patterned, on both the main pattern region 20A and the scribe region 20B. In an etching process 202, the exposed regions of the light blocking mask 24 are removed. Then, the remaining regions of the photoresist layer 26 are removed 204. In another etching process 204, the exposed areas of the mask transmitting layer 22 are removed.

As shown in FIG. 2B, a second photo resist layer 28 is formed 206 on both the main die 20A and scribe regions 20B. The portion of the resist layer 28 on the main die region 20A is then exposed in a second photolithography step 208. This leaves only a portion of the resist layer 28 on the scribe region 20B. The remaining portions of the chrome layer 24 are then removed 210 from the main die region 20A in a suitable etching process. The remaining portions of the resist layer 28 in the scribe region 20B can be removed in a resist strip and clean process 212. This leaves the chrome structures 24 on the scribe region 20B.

However, a phase edge defect 29 will exist at the juncture 28 of the main die region 20A and scribe region 20B. This phase edge defect 29 is unwanted and will require an additional photolithography step to remove the phase edge. A discussion of the elimination of phase edge formation is discussed in U.S. Patent Pub. No. 20050221200, the disclosure of which is incorporated herein by reference in its entirety.

It would be advantageous to be able to prevent overlay shift and avoid phase edge formation during fabrication of a chrome-less phase shifting mask.

SUMMARY OF THE INVENTION

In one aspect, the formation of a chrome-less phase shifting mask includes preparing a mask substrate with a chrome metal layer, forming main and complementary pattern portions in the chrome metal layer, removing a remaining layer of radiation sensitive material, forming another layer of radiation sensitive material over the complementary pattern portion, etching the main pattern portion of the mask substrate using the patterned chrome metal layer as an etch mask, removing remaining portions of the chrome layer from the main pattern portion and removing the layer of radiation sensitive material over the complementary pattern portion.

In another aspect, the formation of a chrome-less phase shifting mask includes combining writing a phase layer and a chrome layer into a single write step, wherein an overlay shift is prevented between the phase layer and the chrome layer.

In a further aspect, a method of manufacturing a mask for use in a photolithographic projection apparatus includes providing a mask blank including a quartz layer and a chrome layer over the quartz layer; applying a first layer of radiation sensitive material on the chrome layer; exposing the first layer of radiation sensitive material to a patterned projection beam of radiation to form a pattern over the chrome layer; removing a portion of the chrome layer corresponding to the pattern; removing remaining portions of the first layer of radiation sensitive material; forming a second layer of a radiation sensitive material over the quartz layer and remaining portions of the chrome layer on a scribe region of the mask; removing portions of the quartz layer on a main pattern region of the mask; removing remaining portions of the chrome layer from the main pattern region of the mask; and removing remaining portions of the second layer of radiation sensitive material from the scribe section of the mask.

BRIEF DESCRIPTION OF THE DRAWINGS

The foregoing aspects and other features of the present invention are explained in the following description, taken in connection with the accompanying drawings, wherein:

FIGS. 3A and 3B illustrate an example of one embodiment of a process flow according to the invention.

FIGS. 4A-4C illustrate an example of one embodiment of a process flow according to the invention.

FIGS. 5A and 5B illustrate an example of one embodiment of a Mesa-type process flow according to the invention.

DETAILED DESCRIPTION OF THE EMBODIMENT(s)

Figure 1A:
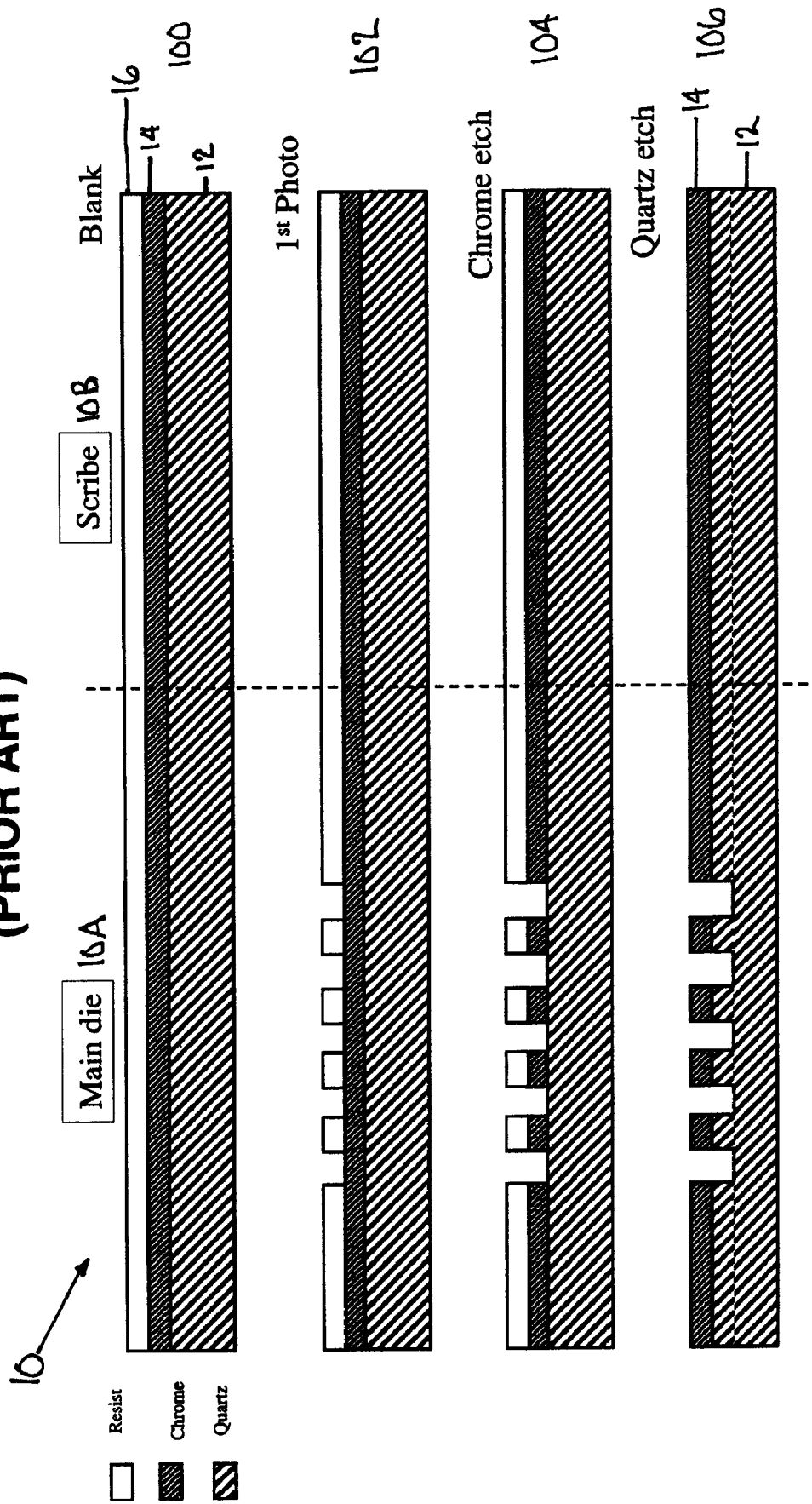
FIGS. 1A and 1b illustrate and example of a prior art two-step process flow for forming a chrome-less phase shifting mask.
Figure 1B:
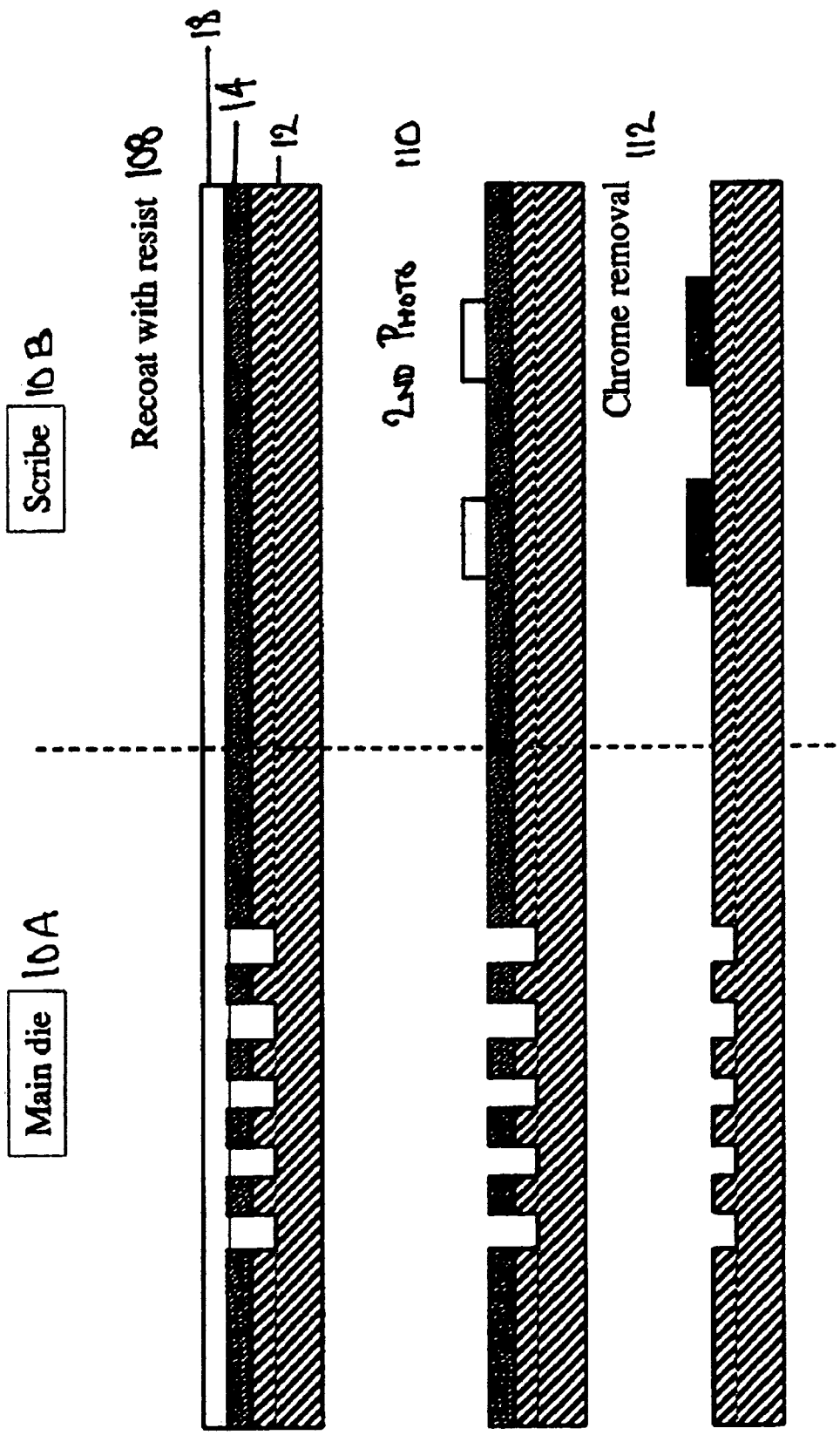
Figure 2A:
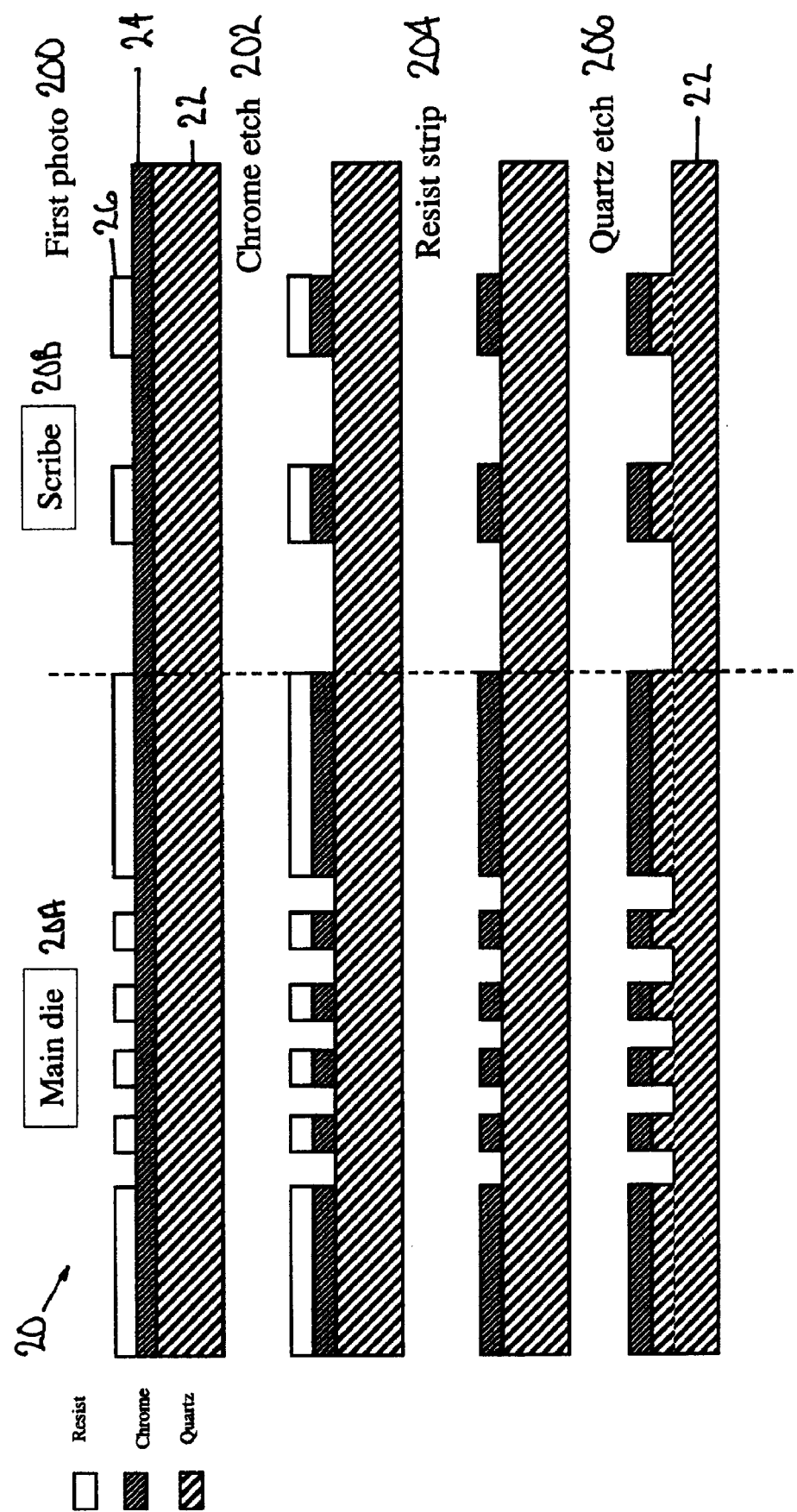
FIGS. 2A and 2B illustrate another example of a prior art one-step process flow for forming a chrome-less phase shifting mask.
Figure 2B:
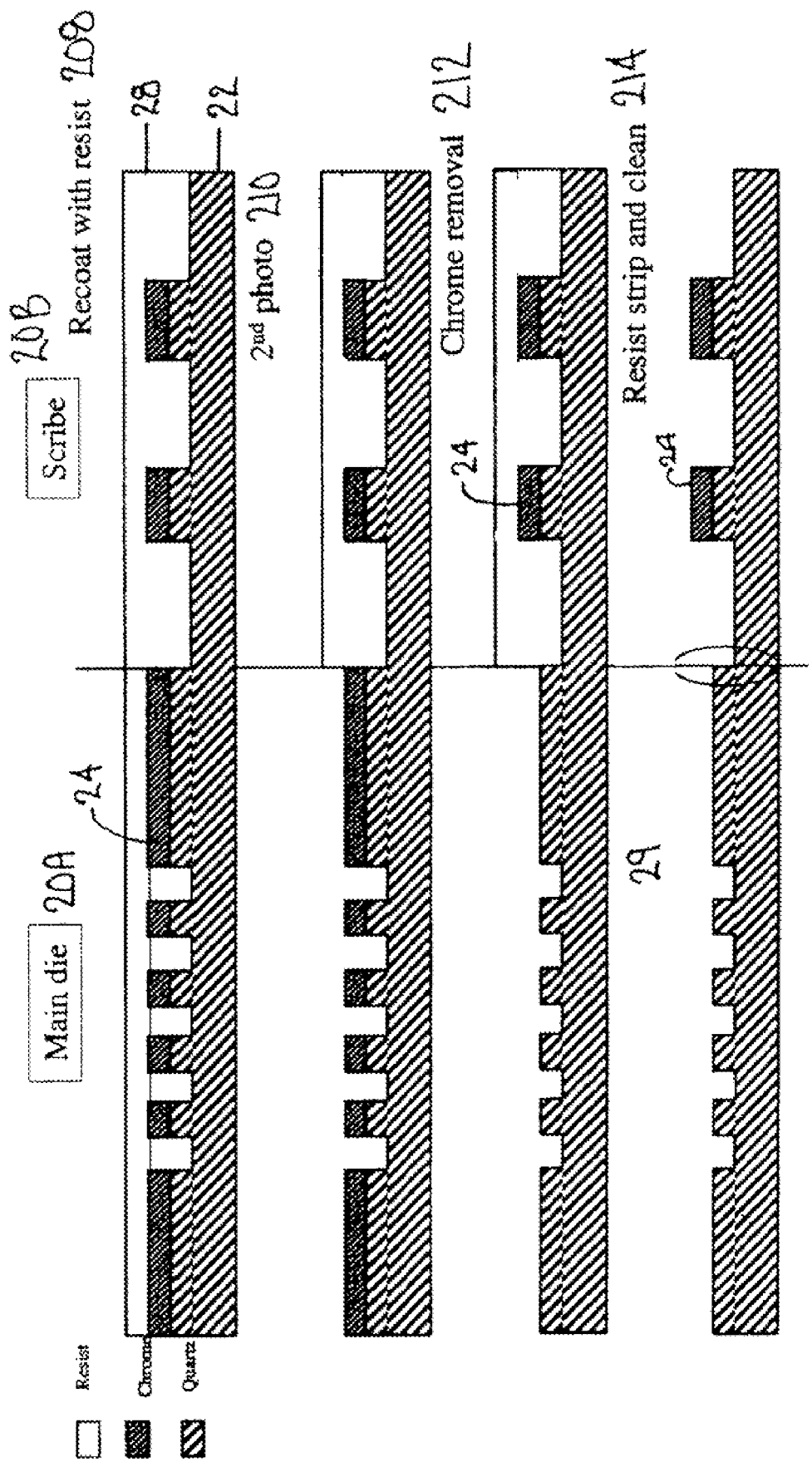
Figure 3B:
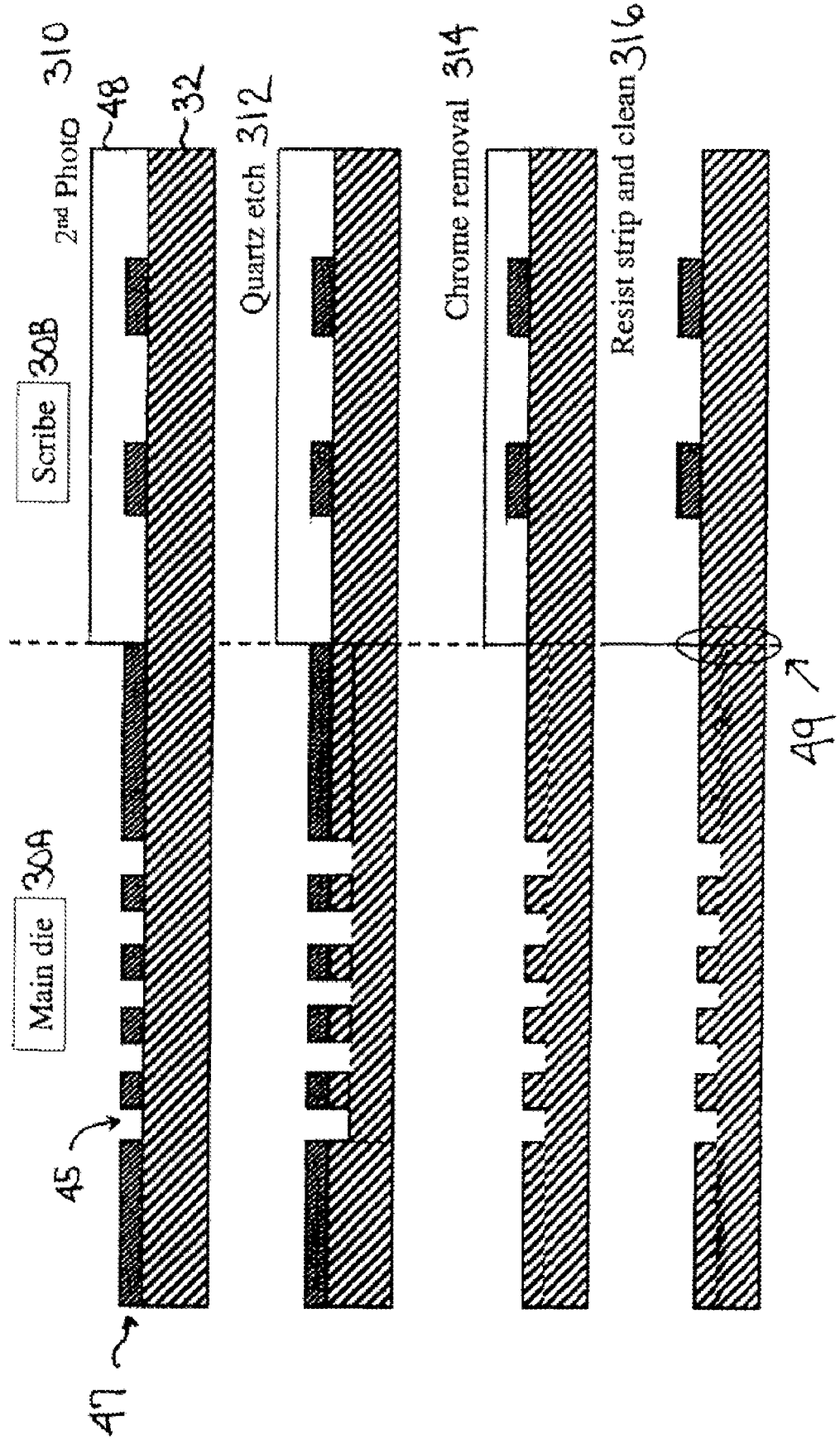

Referring to FIGS. 3A and 3B, one embodiment of a process for forming a chrome-less phase shifting mask incorporating features of the invention is illustrated. Although the aspects of the invention will be described with reference to the embodiments shown in the drawings, it should be understood that the aspects of the invention can be embodied in many alternate forms of embodiments. The process illustrated in FIGS. 3A and 3B combines the writing of the phase layer and the light-blocking or chrome layer in the fabrication of a chrome-less phase shifting mask into a single writing step. This prevents overlay shift between the writing of the phase layer and the light-blocking layer and avoids the formation of a phase edge.

FIG. 3A illustrates a cross-sectional view of a photomash assembly 30. The photomask assembly 30 generally comprises a mask substrate 32 that can comprise a layer of a transparent or light transmitting material, such as quartz for example. In alternate embodiments, the transparent or light transmitted material can comprise any suitable material, other than including quartz. The photomask 30 also includes a light blocking material or mask layer 34, which can also be referred to as a patterned layer. In one embodiment, the light blocking layer 34 can comprise a metal material such as for example, chrome a chromium nitride. In alternate embodiments, the layer of light blocking material can include any suitable material, other than including chrome or chromium nitride. A layer 36 of a radiation sensitive material or photoresist, a resist layer, is formed over the light-blocker mask layer 34 of the light blocking material.

The photomask assembly 30 also includes a main die or patterning region 30A and a complementary pattern region 30B, also referred to herein as a scribe region. The main patterning region 30A will be used to pattern a photoresist on a semiconductor substrate. The scribe region 30B will be used for alignment and overlay control.

Referring to FIG. 3A, in a first lithography, or photolithographic process 304, the photomask assembly 30 is exposed to electromagnetic energy. As shown in FIG. 3A, the resist layer 36 is patterned at specific positions. This leaves one or more unexposed regions 42 of resist material, corresponding to the pattern of the first photolithographic process, on the light-blocker mask layer 34.

In an etching process 306, the exposed areas 44 of the light-blocker mask layer 34 are etched away substantially completely from both the main region 30A and scribe region in FIG. 3B. Any suitable etching process can be used to etch away and remove the light-blocker mask.

The etching 306 of portions 44 of the light-blocker layer 34, exposes areas 46 of the mask substrate layer 32. The remaining regions 42 of the radiation sensitive layer 36 are then stripped 308 away from both the main die region 30A and the scribe region 30B.

Referring to FIG. 3B, a second layer 48 of radiation sensitive material is formed over the remaining regions of the light blocking layer 34. In one embodiment, this second layer 48 of resist material can be formed to a thickness that is generally greater or thicker than a thickness of the first layer 36 of resist material.

In another embodiment, the thickness of the second resist layer 48 is generally thick enough such that the removal of the light-blocker layer 34 and etching of the mask substrate 32 can be carried out without the need for another or separate photolithography process. In alternate embodiments, the thickness of the second resist layer 48 can be any suitable or desired thickness.

In a second photolithography process 310, the second resist layer 48 is exposed over the patterned main die region 38 to expose the patterned portion 47 of the light-blocker layer 34 over the mask substrate 32. The scribe region 30B has a layer of the second resist 48 over the light-blocker layer 34.

In an etching process 312, the exposed areas 45 of the mask substrate layer 32 in the main die region 30A are etched to a predetermined depth. Any suitable process can be used to etch the mask substrate 32.

The remaining portions of the light-blocker layer 34 in the main die region 30A are then removed 314 in any suitable fashion. In embodiment, this can involve a wet etch removal process. This leaves a patterned portion of the mask substrate 32 in the main die region 30A. The second resist 48 remains over the scribe region 30B.

In a resist strip and clean process 316, the remaining portions of the second resist layer 48, on the scribe region 30B, are removed. The resulting structure can be cleaned to remove any particles produced by the etching process. As shown in FIG. 3B, there is no phase edge at the junction 49 of the main die region 30A and scribe region 30B of the resulting structure. Moving the etching 312 of the light-blocking layer after the second photolithography step 310 avoids the formation of the phase edge. Also, by combining the writing of the phase layer and the light-blocker layer into a single step, 306, an overlay shift is prevented between the phase layer and the light-blocker or chrome layer 34.

Figure 4B:
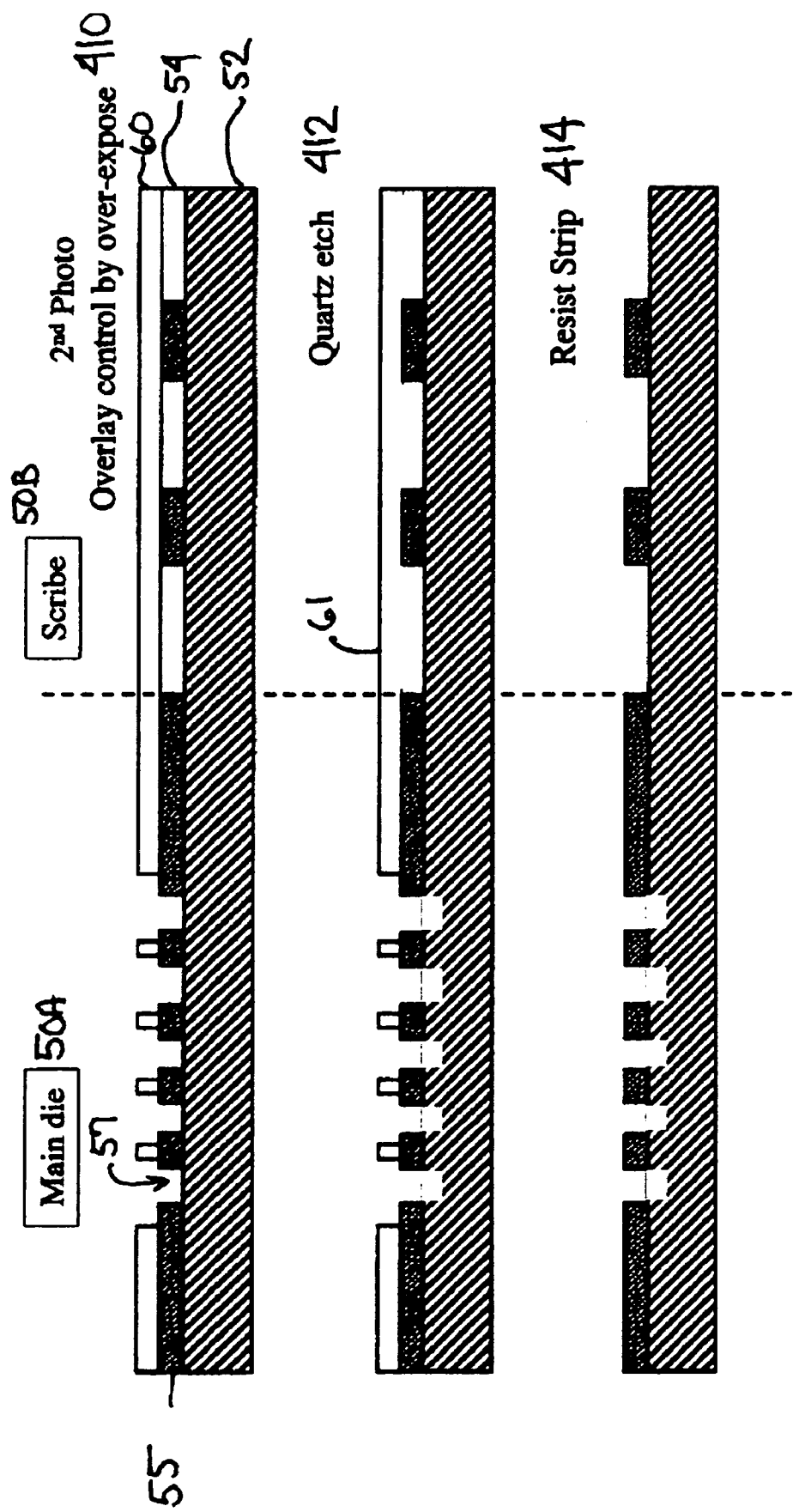

Referring to FIGS. 4A-4C, another embodiment of a process for fabricating a chrome-less phase shifting mask incorporating features of the invention is illustrated. This embodiment comprises three process levels. The first level develops the pattern in the light-blocking layer 54. The second level involves overexposing the substrate in the second lithography process for overlay control and etching the mask substrate layer 52. The third level comprises removal of the light-blocking layer 54. There is a small overlap in the third lithography process to ensure complete removal of the light-blocking layer 54. This avoids a phase edge printing issue.

As illustrated in FIG. 4A, a blank mask 50 is formed 402 with a mask substrate layer 52, a light-blocking layer 54 and a resist layer 56. In one embodiment, the material of the mask substrate layer 52 is quartz and the material of the light-blocking layer 54 is chrome. In alternate embodiments, any suitable material or materials can be used for these layers.

In a first photolithographic process 404, portions of the resist layer 56 are exposed to form a desired pattern over the light-blocking layer 54, in any suitable or desired fashion. The exposed areas 51 of the light-blocking layer 54 are etched 406 using a suitable etching process. The remaining portions 53 of the resist layer 56 are then removed 408 in a suitable resist strip and clean process.

Referring to FIG. 4B, a second layer 60 of radiation sensitive material is formed over the mask substrate 52 and the remaining regions 55 of the light-blocking layer 54 and exposed in a second photolithographic process 410. As shown in FIG. 4B, only the main die region 50A of the photomask 50 is patterned. The scribe region 50B is not. In this second photolithographic process 410, the features are over-exposed in order to control overlay. In one embodiment, the first photolithographic process and the second photolithographic process are carried out with the same mask writer. The overlay can be controlled within for example, a 15 nm to 30 nm range with an advanced tool. The over-exposed strategy will generally ensure that the overlay shift between the first photolithographic process and the second photolithographic process will not cause a critical dimension change of etched quartz.

In a suitable etching process 412, the exposed regions 57 of the mask substrate layer 52 are removed. The remaining regions 61 of the second photoresist layer are then removed 414 in a suitable strip and clean process.

Referring to FIG. 4C, in a third level of processing 416, a third layer 64 of photoresist material is formed over the remaining regions 62 of the light-blocking layer 54 and mask substrate layer 52, and exposed. As shown in FIG. 4C, the third photolithographic process 408 forms a gap 66 at or near the juncture 68 of the main die region 50A and scribe region 50B of the photomask assembly. The gap 66 generally comprises an overlap, also referred to as an extension of exposure onto a portion of the scribe region 50B during the third photolithographic process. This overlap or extended exposure ensures complete removal of the light-blocking layer 54 to prevent phase edge printing.

The remaining regions 62 of the light-blocking layer 54 are removed in a suitable etching process 418. The remaining region 64 of photoresist material is removed 420 in a strip and clean process. As shown in FIG. 4C, in the resulting photomask structure 69 a phase edge is not formed at the juncture 68 of the main die 50A and scribe region 50B. Thus, the process provides overlay control and avoids phase edge printing issues.

Referring to FIGS. 5A and 5B, in one embodiment, a mesa-type process can be used to form a chrome-less phase shifting mask incorporating features of the invention. As shown in FIG. 5A, a first photolithographic process 502 is used to for a pattern in a photoresist layer on a light-blocking layer 72 of a photomask structure 70. The exposed regions 73 of the light-blocking layer 74 are removed 504 in a suitable etching process. The remaining regions 75 of the photoresist layer are removed 506 in a suitable resist strip and clean process. The exposed regions 77 of the mask substrate or quartz layer 72 are then etched in a suitable etching process.

As shown in FIG. 5B, a second layer 80 of photoresist material is formed 510 over the structure. In a second photolithographic process 512, the photoresist on the main die region 70A is exposed. The exposed regions 82 of the light-blocking layer 74 are removed 514 in a suitable etching process. The remaining photoresist material 84 is then removed 516 in a resist strip and clean process. In the resulting structure 86, there is no phase edge at or near the juncture 88 of the main die region 70A and scribe region 70B. Overlay control is maintained since writing of the phase layer and the light-blocking layer occurs in a single write step, 504 to 508.

The disclosed embodiments relate to the fabrication of chrome-less phase shifting masks that prevent overlay shift and eliminates phase edge formation. The aspects of the invention generally comprise combining the writing of the phase layer and the light-blocking or chrome layer into a single process level, or step. An overlay shift is prevented between the phase layer and the chrome layer. A phase edge is not formed between a juncture of a main pattern region and a scribe region of the mask during fabrication of the mask. To avoid phase edge formation, generally, etching of the mask substrate or quartz layer can be moved to occur after a second photolithography process. The second photolithography process can involving forming a layer of resist material on the substrate that is generally thick than a layer of resist material used in the first photolithographic process. The thickness should be sufficient to allow etching of the mask substrate layer and light-blocking layer to occur without another photolithographic process.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method of fabricating a phase shifting mask that comprises a main die region and a scribe region, the method comprising:

forming a first resist layer over a light-blocker layer, the light-blocker layer located over a transparent substrate;

patterning the first resist layer to form a first resist pattern;

etching the light-blocker layer using the first resist pattern to form a light-blocker pattern;

applying a second resist layer over the light-blocker pattern and the transparent substrate;

patterning the second resist layer to form a second resist pattern, the second resist pattern fully covers the scribe region;

etching the transparent substrate in the main die region using a combination of the light-blocker pattern and the second resist pattern as a mask; and removing the light-blocker pattern in the main die region using the second resist pattern as a mask;

wherein at least part of the light-blocker pattern in the scribe region remains after the step of removing the light-blocker pattern in the main die region.

2. The method of claim 1, wherein the step of etching the transparent substrate in the main die region comprises etching the transparent substrate to a predetermined depth to form a transparent pattern of the phase shifting mask.

3. The method of claim 1, wherein an upper surface of the transparent substrate at or near a junction of the main die and scribe regions is flat with no substantial steps.

4. The method of claim 1, wherein the second resist pattern is thick enough such that at least a portion of the second resist pattern remains after the step of removing the light-blocker layer in the main die area.

5. The method of claim 1, wherein the light-blocker layer comprises Cr.

6. The method of claim 1, wherein the transparent substrate comprises quartz.

7. The method of claim 1, wherein the first and second resist layers comprise same or different photoresists.

8. A method of fabricating a phase shifting mask that comprises a main die region and a scribe region, the method comprising:
   forming a first resist layer over a light-blocker layer, the light-blocker layer located over a transparent substrate;
   patterning the first resist layer to form a first resist pattern;
   etching the light-blocker layer using the first resist pattern as a mask to form a light-blocker pattern;
   applying a second resist layer over the light-blocker pattern and the transparent substrate;
   patterning the second resist layer to form a second resist pattern;
   etching the transparent substrate in the main die region using a combination of the light-blocker pattern and the second resist pattern as a mask;
   removing the second resist pattern;
   forming a third resist layer over the transparent substrate and the light-blocker pattern;
   patterning the third resist layer to a third resist pattern; and
   removing the light-blocker pattern in the main die region using the third resist pattern as a mask;
   wherein at least part of the light-blocker pattern in the scribe region remains after the step of removing the light-blocker pattern in the main die region.

9. The method of claim 8, wherein the step of etching the transparent substrate in the main die region comprises etching the transparent substrate to a predetermined depth to form a transparent pattern of the phase shifting mask.

10. The method of claim 8, wherein an upper surface of the transparent substrate at or near a junction of the main die and scribe regions is flat with no substantial steps.

11. The method of claim 8, wherein the light-blocker layer comprises Cr.

12. The method of claim 8, wherein the transparent substrate comprises quartz.

13. The method of claim 8, wherein the first, second and third resist layers comprise same or different photoresists.

14. The method of claim 8, wherein the step of patterning the second resist layer to form a second resist pattern comprises over-exposing the second resist layer in such a way that the second resist pattern is formed over but not between the lighter-blocker pattern in the main die region and fully covers the scribe region.

15. The method of claim 8, wherein the step of patterning the third resist layer to form a third resist pattern comprises exposing the third resist layer in such a way that a gap is formed between the third resist pattern in the scribe region and the light-blocker pattern in the main die region.

16. A method of fabricating a phase shifting mask that comprises a main die region and a scribe region, the method comprising:
   forming a first resist layer over a light-blocker layer, the light-blocker layer located over a transparent substrate;
   patterning the first resist layer to form a first resist pattern;
   etching the light-blocker layer using the first resist pattern as a mask to form a light-blocker pattern, wherein the light-blocker layer at or near a junction of the main die and scribe regions is removed during the step of etching the light-blocker layer;
   etching the transparent substrate using the light-blocker pattern as a mask to form separated features, each of the separated features comprise a light-blocker feature located over a transparent feature;
   applying a second resist layer over and between the separated features;
   patterning the second resist layer to form the second resist pattern fully covering the scribe region and exposing the main die region; and
   removing the light-blocker pattern in the main die region while the scribe region is fully covered by the second resist pattern;
   wherein the light-blocker pattern in the scribe region remains after the step of removing the light-blocker pattern in the main die region.

17. The method of claim 16, wherein the first and second resist layers comprise same or different photoresists.

18. The method of claim 16, wherein the step of etching the transparent substrate in the main die region comprises etching the transparent substrate to a predetermined depth to form a transparent pattern of the phase shifting mask.

19. The method of claim 16, wherein an upper surface of the transparent substrate at or near the junction of the main die and scribe regions is flat with no substantial steps.

20. The method of claim 16, wherein:
   the transparent substrate comprises quartz; and
   the light-blocker layer comprises Cr.

* * * * *

UNITED STATES PATENT AND TRADEMARK OFFICE
CERTIFICATE OF CORRECTION

| | | |
|---|---|---|
| PATENT NO. | : 7,662,521 B2 | Page 1 of 1 |
| APPLICATION NO. | : 11/470359 | |
| DATED | : February 16, 2010 | |
| INVENTOR(S) | : Yung Tin Chen | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 688 days.

Signed and Sealed this

Thirtieth Day of November, 2010

David J. Kappos
*Director of the United States Patent and Trademark Office*